US008639203B2

(12) United States Patent
Robert et al.

(10) Patent No.: US 8,639,203 B2
(45) Date of Patent: Jan. 28, 2014

(54) ANTENNA SYSTEM COMPRISING AN ELECTRICALLY SMALL ANTENNA FOR RECEPTION OF UHF BAND CHANNEL SIGNALS

(75) Inventors: Jean-Luc Robert, Betton (FR); Philippe Minard, Saint Medard sur Ille (FR); Brice Praho, Rennes (FR)

(73) Assignee: Thomson Licensing, Issy-les-Moulineaux (FR)

( * ) Notice: Subject to any disclaimer, the term of this patent is extended or adjusted under 35 U.S.C. 154(b) by 259 days.

(21) Appl. No.: 12/807,031

(22) Filed: Aug. 26, 2010

(65) Prior Publication Data
US 2011/0165853 A1   Jul. 7, 2011

(30) Foreign Application Priority Data

Aug. 28, 2009   (FR) ...................................... 09 55898

(51) Int. Cl.
*H04W 88/02*   (2009.01)
(52) U.S. Cl.
USPC ........... 455/269; 455/107; 455/121; 455/129; 455/193.1; 455/248.1; 455/320; 455/330
(58) Field of Classification Search
None
See application file for complete search history.

(56) References Cited

U.S. PATENT DOCUMENTS

| | | | | |
|---|---|---|---|---|
| 4,053,820 A * | 10/1977 | Peterson et al. | | 363/44 |
| 4,599,581 A * | 7/1986 | Tsironis | | 331/66 |
| 4,739,517 A * | 4/1988 | Okanobu | | 455/321 |
| 6,121,940 A | 9/2000 | Skahill et al. | | |
| 6,414,562 B1 | 7/2002 | Bouisse et al. | | |
| 7,577,411 B2 * | 8/2009 | Chang et al. | | 455/193.1 |
| 2002/0028660 A1 | 3/2002 | Declos | | |
| 2002/0183013 A1* | 12/2002 | Auckland et al. | | 455/73 |
| 2004/0227573 A1 | 11/2004 | Soda | | |
| 2005/0206460 A1* | 9/2005 | Korner | | 331/36 C |

FOREIGN PATENT DOCUMENTS

WO   WO 2008007330   1/2008

OTHER PUBLICATIONS

Search Report, Nov. 30, 2009.

* cited by examiner

*Primary Examiner* — Yuwen Pan
*Assistant Examiner* — Fanghwa Wang
(74) *Attorney, Agent, or Firm* — Myers Wolin LLC

(57) ABSTRACT

An antenna system for reception of channel signals form the UHF band by a receiver, including an electrically small antenna and, connected between the port connected to the antenna and that of the receiver, an active impedance matching device controlled by command signals depending on the quality of the signal received by the receiver to compensate for the impedance variations due to the environment associated with the antenna and to reject the frequencies of interfering channels adjacent to the reception channel without interfering with the active impedance matching of the antenna.

3 Claims, 2 Drawing Sheets

Fig 1 — PRIOR ART

ANTENNA SYSTEM COMPRISING AN ELECTRICALLY SMALL ANTENNA FOR RECEPTION OF UHF BAND CHANNEL SIGNALS This application claims the benefit, under 35 U.S.C. §119, of European Patent Application No. 0955898 of 28 Aug. 2010.

The present invention relates to an antenna system comprising an Electrically Small Antenna (ESA) for reception of UHF band channel signals.

BACKGROUND OF THE INVENTION

The present invention enables use from the lower part of the spectral zone to 1 GHz in the liberated upper part of the UHF (Ultra High Frequency) In fact this zone was previously used for broadcasting television in analogue. The passage of television broadcasting from analogue to digital has thus liberated this zone. These frequencies are dedicated to audio-visual broadcasters to implement High Definition (HD) broadcast services and to mobile operators for the purpose of launching access services to the Internet via cell networks. Their positioning in the UHF spectrum at less than 1 GHz ensures a long range and good penetration in buildings.

But the programmed appearance of Internet access services in the upper part of the UHF spectrum clearly poses the problem of cohabitation in terms of interferences with the DVB_T or DVB_H standard reception services. In fact it is recommended to assign the entirety of the sub-band 790-862 MHz, or 9 channels, to electronic communications.

In addition the miniaturized portable items of equipment are multiband and multimode and have a number of important wireless functions.

Extra flat terminals thus integrating an antenna inside their cover of which some cover 4 to 5 frequency bands and wide band antennas generally have mediocre levels of performance and remain relatively bulky whereas quality antennas are small but of narrow band.

The use of the UHF band located from 470 to 862 MHz renders the design of miniature antennas more delicate. It thus involves electrically small antennas with physical dimensions very much smaller than the wavelength.

As a consequence the performances in terms of efficiency are mediocre. The efficiency is in addition particularly dependent on the influence of the ground plane, the coupling, the positioning within a large number of different circuits and the impedance matching.

A circuit and a method for wideband impedance matching electrically small antennas is known from the document U.S. Pat. No. 6,121,940.

This impedance matching circuit is formed by active circuits simulating the behaviour of a non-Foster reactance such that the circuits at negative capacities and at negative inductances to obtain a wideband matching of electrically small antennas. This impedance matching circuit enables the equivalent reactance of the antenna to be neutralised.

However this circuit relates to frequencies of 30-88 MHz for dipoles of length of approximately 1 meter and is not adapted to the frequencies used by the invention and corresponding to the UHF channels.

In order to realise non-Foster reactance, and active circuit is used that from a positive impedance, capacitive or inductive, will realise its image impedance. This type of structure is referred to as a negative impedance converter.

The principle of a negative impedance converter is described in relation to FIG. 1. Two transistors T1 and T2 are mounted differentially in such a way that the base of the first transistor T1 is connected to the ground plane by the intermediary of a resistance R2 and such that the base of the second transistor T2 is connected to a capacitive element C2.

To compensate for the antenna reactance it suffices therefore to position this converter in series with the antenna, that is to say that the transmitter of the second transistor T2 is connected to port 1 of the antenna and that the transmitter of the first transistor is connected to port 2 of the receiver, so as to obtain a wideband impedance matching.

In the case of small antennas in UHF band, the refection coefficient of the antenna shows that the reactance varies for example from 0.6 pF to 3.5 pF in the UHF band, the results is that a perfect compensation of the antenna reactance would require the same variation law to be followed.

However this concept known as the Linvill concept is only valid at low frequency.

On the other hand if this differential structure at high frequency is analysed, it is noted that it is similar to those used to realise negative resistances in silicon technology and results in the compensation viewed from the receiver side is tainted with an additional positive resistance.

In addition this circuit being positioned directly after the antenna it is important that it does not introduce attenuation that would penalise the sensitivity or the gain of such a structure.

Thus if a gain of 1 GHz must be ensured, the cut-off frequency defined by the resistance R2 and the parasite capacity of the collector of transistor T2 must be greater than 1 GHz.

SUMMARY OF THE INVENTION

The invention aims to overcome these problems.

The invention consists in an antenna system for reception of channel signals from the UHF band by a receiver comprising an electrically small antenna. The system comprises connected between the antenna port and that of the receiver, an active impedance matching device controlled by command signals depending on the quality of the signal received by the receiver to compensate for the impedance variations due to the environment associated with the antenna and to reject the frequencies of interfering channels adjacent to the reception channel without interfering with the active impedance matching of the antenna.

The concept of the invention will enable through the addition of an active impedance matching device to guarantee a level of performance of the electrically small antennas over the entire UHF band thus permitting an optimal level of sensitivity. Also the addition of a network of rejecter filters that can be tuned, managed by the processor of the terminal will ensure a management of potential interferences from the upper part of the UHF spectrum while conserving the possibilities for reception of new services proposed in this frequency zone.

Preferentially, the active impedance matching device comprises a negative impedance converter of variable capacity formed by a first transistor and a second transistor mounted differentially, for which the respective transmitters of each transistor are connected to a power source by a Choke double inductance, creating a de-coupled reference point at RF level.

Preferentially, the active impedance matching device comprises a filtering network formed by a parallel network of active rejecter filters connected to each extremity of the Choke double inductance.

Preferentially, the base of the first transistor of the negative impedance converter is connected to the ground plane via the intermediary of an inductance whereas the base of the second transistor of the negative impedance converter is connected to the ground plane via the intermediary of a variable capacity to realise an impedance matching.

Preferentially, a first command signal for the control of the variable capacity of the negative impedance converter and a command signal for the control of variable capacities of the filtering network are delivered via receiver information signifying the level received or the presence of a high level of interference analysed via a control block associated with the receiver.

BRIEF DESCRIPTION OF THE DRAWINGS

The characteristics and advantages of the aforementioned invention will emerge more clearly upon reading the following description made with reference to the drawings attached in the appendix, wherein.

DETAILED DESCRIPTION OF PREFERRED EMBODIMENTS

Figure 2:
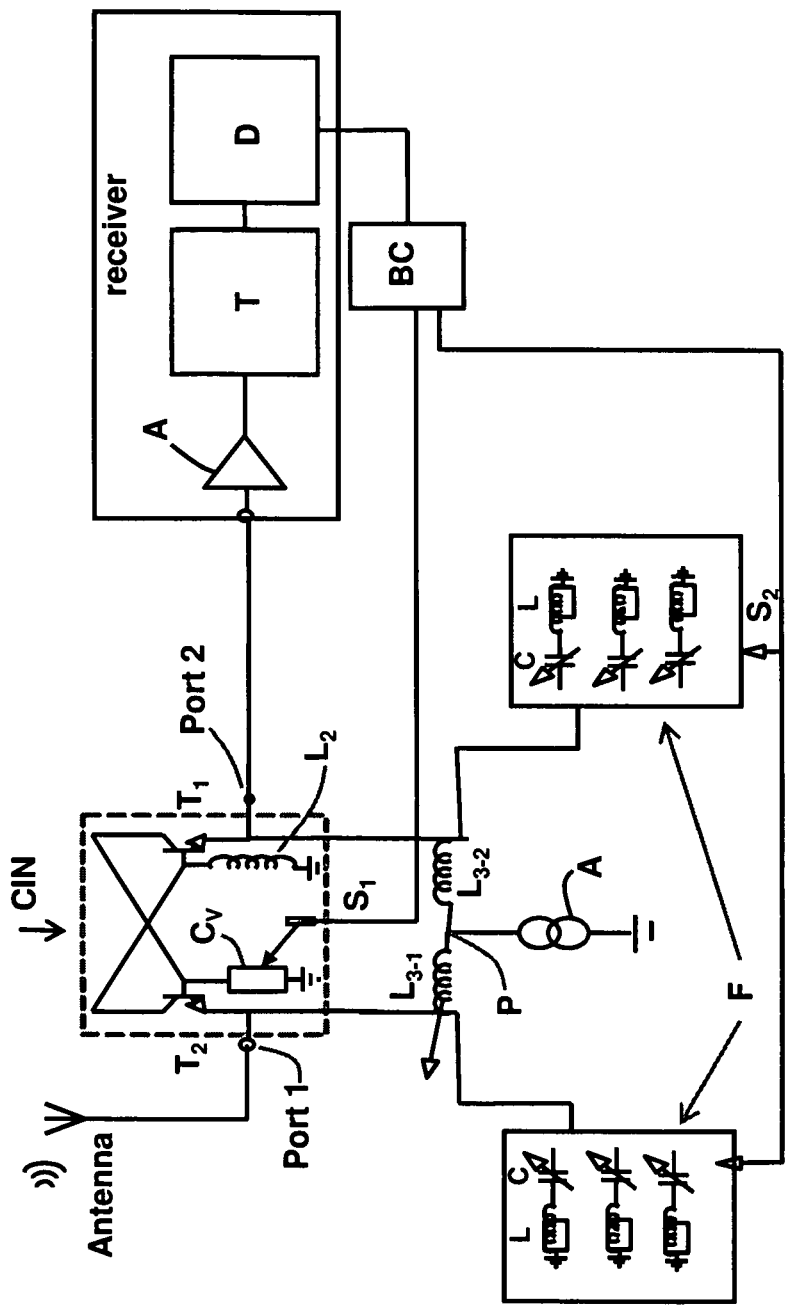

FIG. 2 describes the principle of the invention. An antenna system according to the invention thus comprises an electrically small antenna in which the input port 1 is connected via the port 2 of an impedance matching device to a receiver for the reception of UHF band channel signals via a standard receiver for example a DVB-H receiver itself comprising an amplifier A, a tuner element T and a demodulator D.

Figure 1:
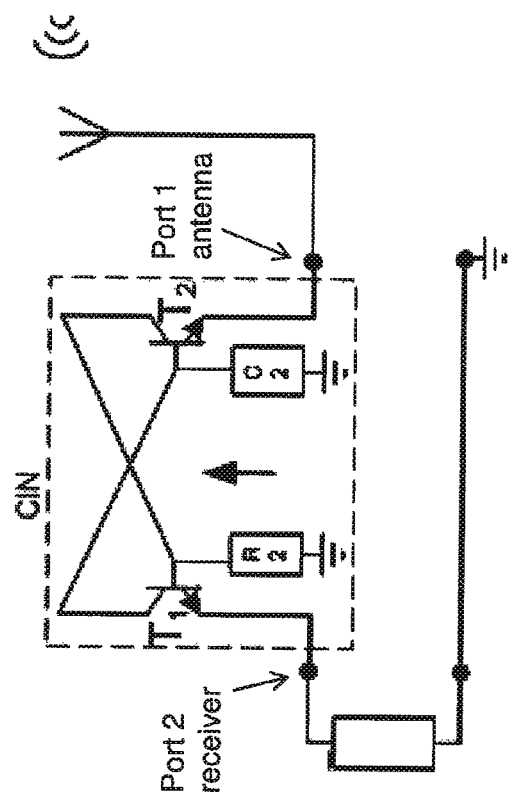
FIG. 1, already described, describes an adaptation of an electrically small antenna using a negative impedance converter according to the prior art, FIG. 2 describes an antenna system according to the invention.

The impedance matching device is firstly formed by a digital impedance converter CIN as described with the aid of FIG. 1 and comprising the addition of an inductance L2 connected to the base of the transistor T1 that enables both a gain in the frequencies limit of the UHF band to be realised, for example a gain of 6 to 8 dB, and also enables the capacitive compensation to be made linear according to the frequency of the signal received.

A variable capacity Cv replaces the capacity C2 of the negative impedance converter CIN as described with FIG. 1. It is controlled by a signal S1 managed by a command block BC associated with the receiver demodulator and enables a signal S1 to be transmitted that acts on the variable capacity Cv to take into account the control effects that lead to, depending on the antenna structure and/or terminal, phenomena of mismatching and loss of sensitivity. The detection of a voltage according to a defined threshold authorizes the transmission of a control voltage that modifies the capacity Cv of the converter thus acting directly on the impedance matching of the antenna and thus on its efficiency.

The impedance matching device comprises, associated with the negative impedance convertor CIN in the way described hereafter, a filtering network that can be tuned F by a control signal S2 managed by the command block BC. In fact management of interfering elements of the active impedance matching system is necessary with regard to the cohabitation in the upper part of the spectrum of Internet access services and thus elements that may potentially cause interference for the DVB_H receivers.

Being also part of the impedance matching device, a power source A connected to the transistor transmitters T1 and T2, ensures the DC polarization of transistors T1 and T2.

The transmitters of transistors T1 and T2 are decoupled at the level RF by a Choke double inductance L3-1 and L3-2. Hence the polarisation of transistors for which each of the transmitters is connected to one of the extremities of this Choke double inductance L3-1 and L3-2 is ensured and the central point P of this double inductance connected to the power source A is a reference point (cold point) decoupled at the level RF.

This reference point P is here used judiciously in order to place the filtering networks composed of rejecter filters. It suffices in fact to resonate the inductance L3 at a high value (Choke) and thus not interfere with the RF functioning of the converter with a capacity adequate to realise a rejecter filter.

The filtering network comprises a parallel network of active rejecter filters LC connected to each of the transistor transmitters and controlled by a signal S2 managed via a command block BC associated with the receiver processor. This structure thus enables the rejection to be increased. FIG. 2 shows the rejection of 3 interfering channels linked to the "digital dividend" that corresponds to the use of the spectral zone beneath the liberated GHz. The number of rejecter filters depends on the number of interfering channels.

Within the context of the functioning of the terminal in the Digital Dividend environment a scanning method enables the interfering elements at high levels to be located and memorised in terms of frequency, the terminal being in DVB_H reception mode. The information from the wide band detector (WBD) enables the presence of an element interfering with reception to be detected, this information transmitted to the control block then authorises the activation of a rejecter filter on the interfering element closest to the DVB_H channel received. If the information from the WBD (Wide Band Detector) returns above a defined threshold the interfering element is filtered. If the interference persists, the activation of a second rejecter is then authorised on the closest neighbouring interfering element.

The concept thus enables the elimination of, for example, 3 Internet access type channel interfering elements on the upper part of the UHF spectrum.

This concept of active impedance matching has been validated in the UHF band on an electrically small antenna.

The results in terms of impedance matching present a notable improvement as the antenna alone has a return loss coefficient of less than 1 dB or a transmission loss in the order of 16 dB.

Measurements in an indoor environment enabled the gain of such a concept to be highlighted that are translated by a margin of 3 to 6 dB on the C/N ratio, the quality criterion required to ensure error free reception The proposed network of rejecter filters that can be tuned can be implemented by the use of MEMS (Micro-Electro-Mechanical Systems) technology enabling a high number of switchable capacities on a miniature substrate.

The control block BC transmits a first command signal S1 for the control of the variable capacity Cv of the negative impedance converter and a command signal S2 for the control of the variable capacities of the filtering network. Information from the receiver on the quality of the signal received, such as information on the Automatic Gain Control (AGC) signifying the level received, or such as information from the WBD (Wide Band Detector) detector, signifying the presence of a high level interfering element, or such as other information signifying errors (ECC) or interferences are analysed by this control block BC according to a defined threshold to define the commands of the variable capacity Cv of the converter CIN and the variable capacities C of the network of rejecter filters. It is principally equipped with DAC (Digital Analogical Circuit) thus ensuring interfacing with the capacities of voltage controlled MEMS technology.

What is claimed is:

1. An antenna system for reception of channel signals from the UHF band by a receiver, comprising:
   an electrically small antenna; and
   connected between the port connected to the antenna and that of the receiver,
   an active impedance matching device,
   wherein the active impedance matching device is controlled by command signals depending on the quality of the signal received by the receiver and comprises a negative impedance converter of variable capacity to compensate for the impedance variations due to the environment associated with the antenna connected to a filtering network formed by a parallel network of active reject filters of variable capacities to reject the frequencies of interfering channels adjacent to the reception channel;
   wherein the negative impedance converter of variable capacity is formed by a first transistor and a second transistor mounted differentially, the base of the first transistor is connected to the ground plane via an inductance L2 and the base of the second transistor is connected to the ground plane via a variable capacity Cv to realize an impedance matching; and
   wherein a first command signal S1 for the control of the variable capacity C of the negative impedance converter and a second command signal S2 for the control of variable capacities of the filtering network are delivered via receiver information signifying the level of the signal received or the presence of a high level of interference according to a defined threshold.

2. Antenna system according to claim 1 wherein the respective transmitters of each transistor are connected to a power source via a Choke double inductance, creating a reference point decoupled at the level RF.

3. Antenna system according to claim 2 wherein the filtering network is connected to each extremity of the Choke double inductance.

* * * * *